United States Patent
Wang et al.

(10) Patent No.: US 8,763,235 B1
(45) Date of Patent: Jul. 1, 2014

(54) METHOD FOR BONDING SUBSTRATES IN AN ENERGY ASSISTED MAGNETIC RECORDING HEAD

(75) Inventors: Lei Wang, Fremont, CA (US); Luc Ving Chung, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 192 days.

(21) Appl. No.: 13/525,731

(22) Filed: Jun. 18, 2012

Related U.S. Application Data (62) Division of application No. 12/880,785, filed on Sep. 13, 2010, now Pat. No. 8,220,140.

(51) Int. Cl.
  *G11B 5/127* (2006.01)
  *H04R 31/00* (2006.01)

(52) U.S. Cl.
  USPC .......... 29/603.03; 29/603.04; 29/603.07; 257/E21.008; 257/E27.046

(58) Field of Classification Search
  USPC .......... 29/603.03–603.07; 257/E21.008, 257/E27.046; 338/28, 30
  See application file for complete search history.

(56) References Cited

U.S. PATENT DOCUMENTS

| | | | |
|---|---|---|---|
| 5,325,384 A | 6/1994 | Herb et al. | |
| 5,767,580 A | 6/1998 | Rostoker | |
| 5,907,405 A * | 5/1999 | Mizutani et al. | 356/399 |
| 6,163,463 A | 12/2000 | Marrs | |
| 6,245,594 B1 | 6/2001 | Wu et al. | |
| 6,294,840 B1 | 9/2001 | McCormick | |
| 6,365,842 B1 | 4/2002 | Jiang | |
| 6,417,685 B1 | 7/2002 | Akram et al. | |
| 6,504,253 B2 | 1/2003 | Mastromatteo et al. | |
| 6,579,744 B1 | 6/2003 | Jiang | |
| 6,859,346 B1 | 2/2005 | Meyer | |
| 6,963,143 B2 | 11/2005 | Howarth | |
| 6,991,960 B2 | 1/2006 | Howarth | |
| 7,005,319 B1 | 2/2006 | Chen et al. | |
| 7,141,450 B2 | 11/2006 | Pardo | |
| 7,169,649 B2 | 1/2007 | Rosa et al. | |
| 7,203,387 B2 | 4/2007 | Doan | |
| 7,307,020 B2 | 12/2007 | Leedy | |
| 7,332,411 B2 | 2/2008 | McKinnell et al. | |
| 7,349,614 B2 | 3/2008 | Doan | |
| 7,408,618 B2 * | 8/2008 | Visser | 355/53 |
| 7,482,199 B2 | 1/2009 | Khandekar et al. | |

(Continued)

OTHER PUBLICATIONS

Office Action dated Dec. 14, 2011 from U.S. Appl. No. 12/880,785, 11 pages.

(Continued)

*Primary Examiner* — Paul D Kim (57) ABSTRACT

A method for bonding a first substrate to a second substrate is described. The first substrate includes a first plurality of solder pads, a first alignment mark set, and a first plurality of dots. The second substrate includes a second plurality of solder pads, a second alignment mark set, and a second plurality of dots configured to interlock with the first plurality of dots. The method includes aligning the first alignment mark set with the second alignment mark set. The first alignment mark sets being aligned corresponds to the dots and the solder pads being aligned. The method also includes locking the first plurality of dots with the second plurality of dots to form an interlocking key. The method also includes reflowing at least one of the first and second pluralities of solder pads. The dots remain substantially solid during the reflow.

14 Claims, 5 Drawing Sheets

(56) References Cited

U.S. PATENT DOCUMENTS

| | | |
|---|---|---|
| 7,534,660 B2 | 5/2009 | Lee |
| 7,562,686 B2 | 7/2009 | Best et al. |
| 7,569,939 B2 | 8/2009 | Khandekar et al. |
| 8,220,140 B1 | 7/2012 | Wang et al. |
| 2002/0000649 A1 | 1/2002 | Tilmans et al. |
| 2005/0057641 A1 | 3/2005 | Ogihara et al. |
| 2006/0233061 A1 | 10/2006 | Rausch et al. |
| 2008/0136955 A1 | 6/2008 | Kathman et al. |

OTHER PUBLICATIONS

Notice of Allowance dated Mar. 19, 2012 from U.S. Appl. No. 12/880,785, 5 pages.

* cited by examiner

FIG. 18

METHOD FOR BONDING SUBSTRATES IN AN ENERGY ASSISTED MAGNETIC RECORDING HEAD

CROSS REFERENCE TO RELATED APPLICATIONS

This application is a divisional of U.S. patent application Ser. No. 12/880,785, filed on Sep. 13, 2010, now U.S. Pat. No. 8,220,140, which is hereby incorporated by reference in its entirety.

BACKGROUND

In fabricating disk drives, such as energy assisted magnetic recording (EAMR) disk drives, it may be necessary to bond substrates. For example, in conventional EAMR disk drives, a laser provides energy used to heat the media for magnetic recording. The laser typically takes the form of a laser diode. The laser diode may be desired to be bonded with the slider.

Figure 1:
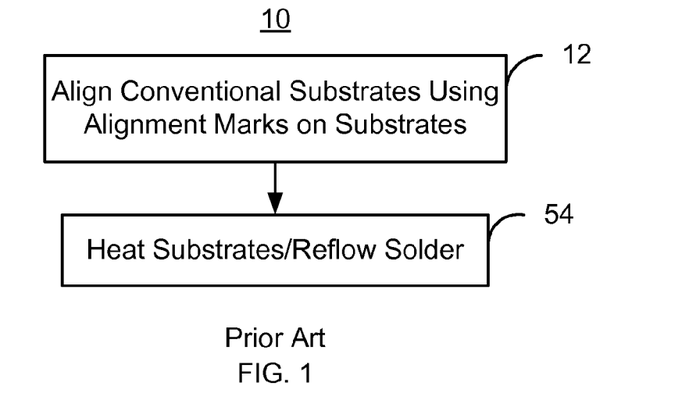
FIG. 1 is a flow chart depicting a conventional method for bonding a conventional laser diode and a conventional slider.
Figure 2:
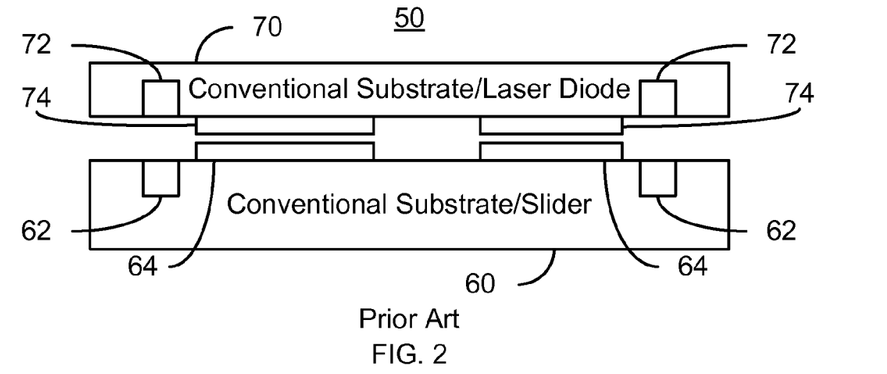
FIGS. 2-3 are diagrams depicting the conventional laser diode and slider during bonding.
Figure 3:
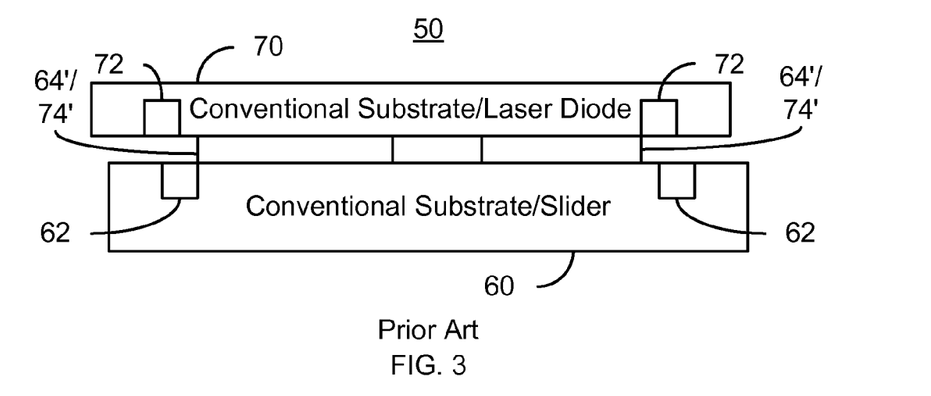

FIG. 1 depicts a conventional method 10 for bonding two substrates, such as a conventional laser diode (or substrate on which the laser diode resides) and a slider. FIGS. 2-3 depict a conventional EAMR head 50 during fabrication using the conventional method 10. Thus, two conventional substrates, a slider 60 and a laser diode 70 are shown. Each conventional substrate 60 and 70 includes conventional alignment marks 62 and 72, respectively. Each conventional substrate 60 and 70 also includes conventional solder pads 64 and 74, respectively. The conventional substrates 60 and 70 are aligned, via step 12. Typically this is accomplished by aligning the alignment marks 62 on one substrate 60 with the alignment marks 72 on the other substrate 72. FIG. 2 depicts the conventional substrates 60 and 70 after step 12. Thus, the alignment marks 62 and 72 and solder pads 64 and 74 are aligned.

Once alignment has been achieved, the substrates 60 and 70 are heated to reflow the solder 64 and 74. FIG. 3 depicts the conventional substrates 60 and 70 after step 14 is performed. Mechanical and electrical connection is made between the substrates 60 and 70 by pads 64'/74', which have been reflowed together.

Although the conventional method 10 may function, the alignment achieved after the reflow step 14 may be limited. For example, after the method 10 is completed, the post-bonding alignment accuracy may be on the order of greater than one micron. For example, as can be seen by comparing FIGS. 2 and 3, the substrates 60 and 70 have moved with respect to each other after the reflow. In applications, such as EAMR heads 50, greater alignment accuracy is desired.

Accordingly, what is needed are improved methods and systems for bonding substrates, for example in bonding substrates used in EAMR disk drives.

BRIEF SUMMARY OF THE INVENTION

A method and system for performing bonding of a first substrate to a second substrate are described. The first substrate includes a first plurality of solder pads and a first alignment mark set. The second substrate includes a second plurality of solder pads and a second alignment mark set. The method and system include aligning the first alignment mark set on the first substrate to the second alignment mark set on the second substrate. The first substrate includes a first plurality of dots. The second substrate includes a second plurality of dots configured to interlock with the first plurality of dots. The first alignment mark set being aligned with the second alignment mark set corresponds to the first plurality of dots being aligned with the second plurality of dots and the first plurality of solder pads being aligned with the second plurality of solder pads. The method and system also include locking the first plurality of dots with the second plurality of dots to form an interlocking key. In addition, the method and system include reflowing at least one of the first plurality of solder pads and the second plurality of solder pads. The first plurality of dots and the second plurality of dots remain substantially solid during the reflowing step.

DETAILED DESCRIPTION OF EMBODIMENTS OF THE INVENTION

Figure 4:
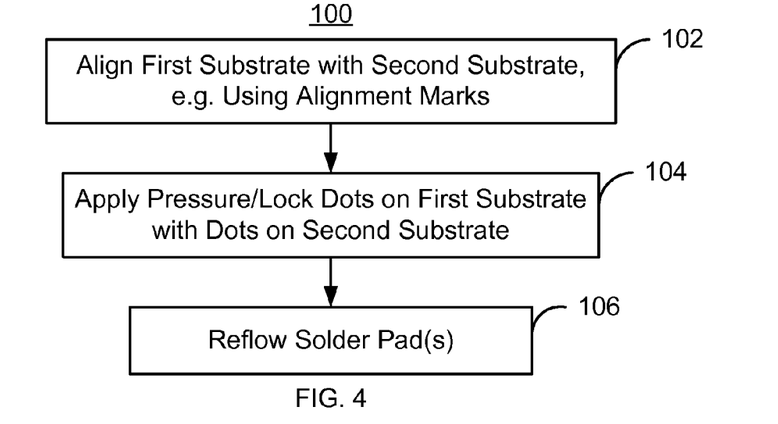
FIG. 4 is a flow chart depicting an exemplary embodiment of a method for bonding substrates, for example in fabrication of an EAMR head.

FIG. 4 is a flow chart depicting an exemplary embodiment of a method 100 for bonding substrates, for example in fabrication of an EAMR head. FIGS. 5-8 are diagrams depicting side and plan views of an EAMR head 120 during fabrication. For clarity, FIGS. 5-8 are not to scale. Further, for simplicity, not all components are labeled in FIGS. 5-8. Referring to FIGS. 4-8, the method 100 is described in the context of substrates used in fabricating the EAMR head 120. However, the method 100 may be used to form another device (not shown). The EAMR head 120 being fabricated may be part of a merged head that also includes a read transducer (not shown in FIG. 5-8) and resides on a slider of a disk drive.

Figure 5:
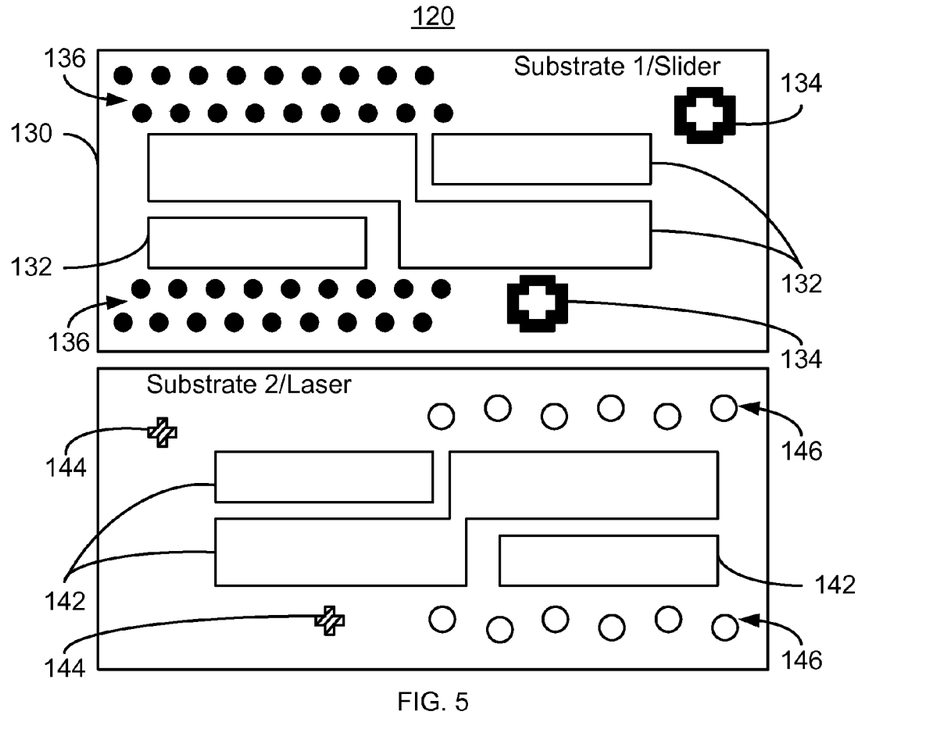
FIG. 5 is a plan view depicting an exemplary embodiment of substrates to be bonded.

FIG. 5 depicts the substrates 130 and 140 for the EAMR head 120 before the method 100 commences. For simplicity, only portions of the components on the substrates 130 and 140 are shown. In the embodiment shown, the substrate 130 is the slider while the substrate 140 corresponds to the laser. In some embodiments, the substrate 140 may be a laser diode, while in other embodiments, the substrate 140 may be a component on which the laser diode is mounted. However, in other embodiments, the substrates 130 and 140 may correspond to other components. In addition, devices other than an EAMR head 120 may be fabricated. The substrate 130 includes solder pads 132 and an alignment mark set 134. In the embodiment shown, the solder pads 132 include an under bump metal (UBM) and solder. The UBM typically includes an adhesion layer and a barrier layer. In some embodiments, the adhesion layer may be a material including Cr, Ti, and/or Ta. The barrier layer resides between the solder and the adhesion layer so that the adhesion layer is not dissolved into the solder. The barrier layer may include materials such as one or more of Pt, Ni, W, and Nb. The solder may be low temperature solder. However, in other embodiments, the solder pads 132 may be formed of different materials. Each mark in the alignment mark set 134 is in the form of a plus sign. Further, in the embodiment shown, each mark in the alignment mark set 134 is a female. The female alignment marks 134 are shown in black. The substrate 140 includes solder pads 142 and an alignment mark set 144. In the embodiment shown, the solder pads 142 include UBM and solder. In some embodiments, the UBM may have a structure analogous to that described above for the substrate 130. However, in other embodiments, the solder pads 142 may be formed of different materials. Each mark in the alignment mark set 144 is in the form of a plus sign, or cross. Further, in the embodiment shown, each mark in the alignment mark set 144 is a male. The male alignment marks 144 are shown as cross-hatched. However, in other embodiments, the male alignment mark set 144 could be on the first substrate 130 and the female alignment mark set 134 could be on the second substrate 140.

The first substrate 130 includes a first set of dots 136. Similarly, the second substrate 140 includes a second set of dots 146. The dots 136 and 146 are configured to interlock, forming an interlocking key during the bonding process. The dots 136 and/or 146 may be made of a material including at least one of Au, Cu, Ni, and NiFe. Although shown as having circular cross sections, the dots 136 and/or 146 may have another cross section. For example, the dots 136 and/or 146 may have a substantially rectangular cross-section, and/or a re-entrant cross-section. In addition, all of the dots 136 and 146 need not have the same cross-section. Although shown as cylindrical in shape, the dots 136 and/or 146 may have another shape. For example, one or more of the dots 136 and 146 may have a tapered top. Finally, a particular arrangement of the solder pads 132/142, the alignment mark sets 134/144, and/or the dots 136/146 could differ in other embodiments.

Figure 6:
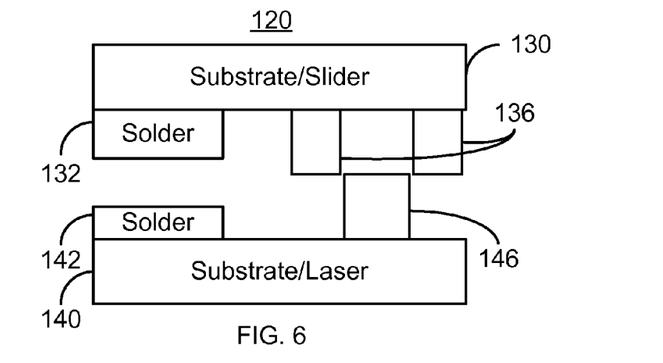
FIG. 6 is a side view of portions of the exemplary embodiment of substrates to be bonded after alignment.

The substrates 130 and 140 are aligned, via step 102. Step 102 is performed by the first alignment mark set 134 on the first substrate 130 to the second alignment mark set 144 on the second substrate 140. In some embodiments, step 102 includes aligning the substrates 130 and 140 to within a desired tolerance. In some embodiments, the desired tolerance is not more than one micron. In some such embodiments, the tolerance is not more than 0.5 micron. By aligning the alignment mark sets 134 and 144, the bond pads 132/142 and the dots 136/146 are aligned. FIG. 6 depicts a side view of a portion of the EAMR head 120 after step 102 is performed. Thus, the solder pads 132 and 142 are aligned. In addition, the dot 146 on the substrate 140 is aligned with a gap between the dots 136.

Figure 7:
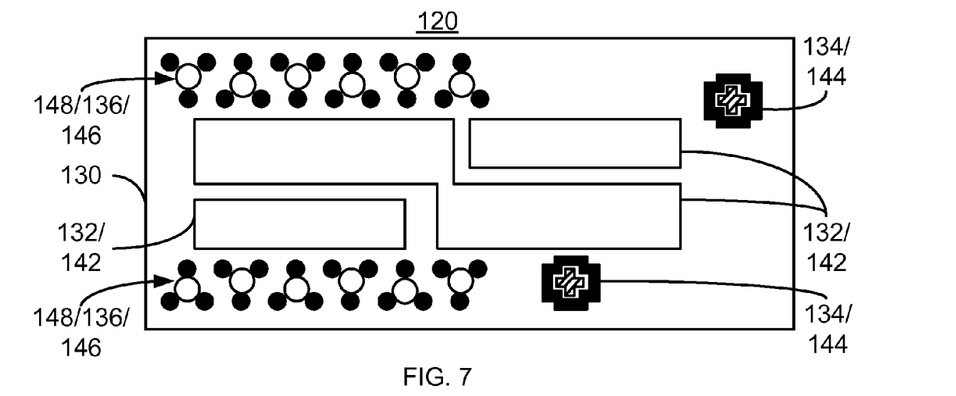
FIG. 7 is a plan view depicting an exemplary embodiment of substrates to be bonded after alignment and locking.
Figure 8:
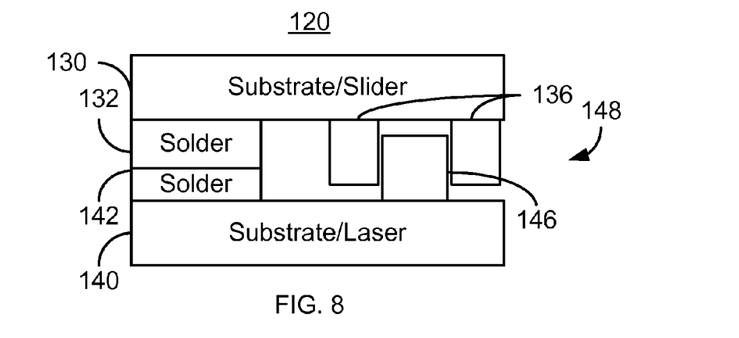
FIG. 8 is a side view of portions of the exemplary embodiment of substrates to be bonded after alignment and locking.

The first set of dots 136 is locked with the second set of dots 146 to form an interlocking key, via step 104. Step 104 may include applying pressure to one or both of the substrates 130 and 140. FIGS. 7-8 depict plan and sides views of the head 120 during fabrication. Thus, interlocking key 148 has been formed by the dots 136 and 146. In the embodiment shown, the dots 136 and 146 are not collinear. However, in other embodiments, the dots 136 and/or 146 may be collinear as long as they form an interlocking key that restricts the relative movement of the substrates 130 and 140. The dots 136 are also shown as having the same cross-sectional shape and a different size than the dots 146. In other embodiments, the dots 136 and 146 may have different shapes and/or have the same cross-sectional size. The alignment marks 134 and 144 also fit together. More specifically, the male alignment mark 144 fits within the female 134.

A solder reflow is performed, via step 106. In some embodiments, step 106 includes exposing at least a portion of the substrate(s) 130 and 140 to heat. In some embodiments, one pad 132 or 142 remains solid, while the other pad 142 or 132, respectively, becomes liquid during the reflow step 106. However, in other embodiments, both pads 132 and 142 may become liquid during the reflow step 106. During the reflow step the dots 136 and/or 146 remain substantially solid. As a result, the dots 140 and 130 remain locked within a desired tolerance during the reflow step. In some embodiments, the dots 130 and 140 remain within the tolerances with which they were aligned.

Using the method 100, the bonding of substrates, such as in the EAMR head 120 may be improved. The interlocking key 148 is formed by the dots 136 and 146. The interlocking key 148 confines the relative motion of the substrates 130 and 140. Because the dots 136 and 146/interlocking key 148 remain solid during the reflow step, the alignment between the substrates 130 and 140 is substantially preserved during the reflow of step 106. Despite at least some portion of the solder pads 132/142 becoming liquid during the reflow step, the alignment achieved in step 102 may be substantially unchanged. In some embodiments, the substrates 130 and 140 remain aligned to within one micron throughout the process 100. In some such embodiments, the substrates 130 and 140 remain aligned to not more than 0.5 micron throughout the reflow. Consequently, alignment throughout the bonding process may be improved.

Further, the locking step 104 may improve the mechanical stability of the bonding. In some embodiments, the locking step 104 may actually form a joint between the dots 136 and 146. For example, when clean, two gold surfaces which rub together may form a gold bond. If at least some portion of the dots 136 and some portion of the dots 146 are gold, pressing the substrates 130 and 140 together to form interlocking key 148 may cause the bumps 136 and 146 to rub together. Those dots 136 and 146 that are gold may be pressed together with sufficient shear force to form a gold bond. Thus, in addition to interlocking because of the geometry of the patterns of the dots 136 and 146, the key 148 may actually interlock due to gold bonds. Consequently, the alignment between the substrates 130 and 140 may be better preserved.

Figure 9:
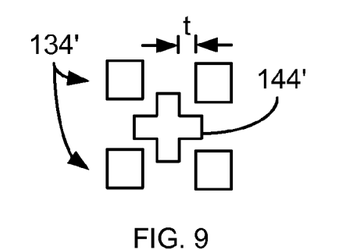
FIGS. 9-10 depict exemplary embodiments of alignment marks that may be used in aligning substrates.
Figure 10:
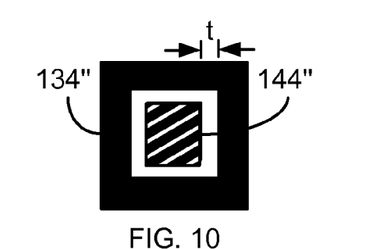

Other configurations are possible in addition to those described above. For example, FIGS. 9-10 depict exemplary embodiments of alignment mark sets 134'/144' and 134"/144" that may be used in aligning substrates 160 and 170. For clarity FIGS. 9-10 are not to scale. For example, FIG. 9 depicts an alignment mark set in which a cross 144' is aligned within squares 134'. The alignment is to within a desired tolerance, t. In some embodiments, t is not more than 0.5 micron. In other embodiments, t may differ. Similarly, FIG. 10 depicts an alignment mark set in which a rectangular alignment mark 144" fits within a female alignment mark 134". Female alignment mark 134" is shown as black, while male alignment mark 144" is shown as cross-hatched. One or more of the alignment mark sets 134/144 depicted in FIGS. 5-8 may be replaced by the alignment mark set 134'/144', 134"/144", or another alignment mark set. The alignment is to within a desired tolerance, t. In some embodiments, t is not more than 0.5 micron. In other embodiments, t may differ.

Figure 11:
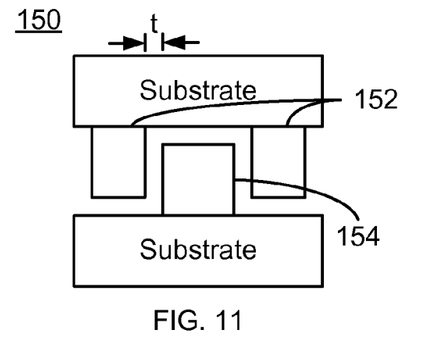
FIGS. 11-18 are diagrams depicting exemplary embodiments of dots forming an interlocking key for bonding substrates.
Figure 12:
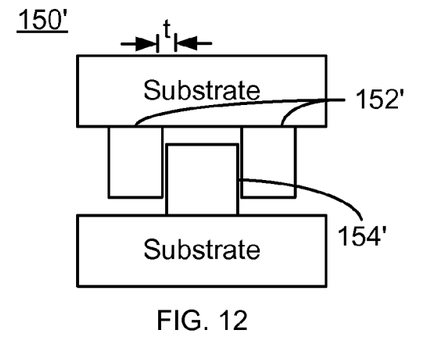
Figure 13:
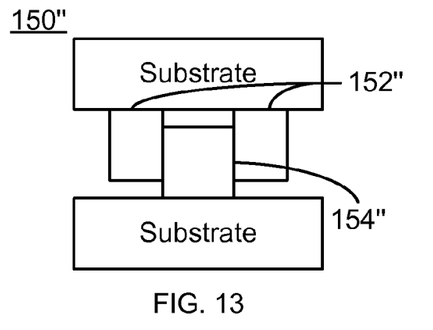
Figure 14:
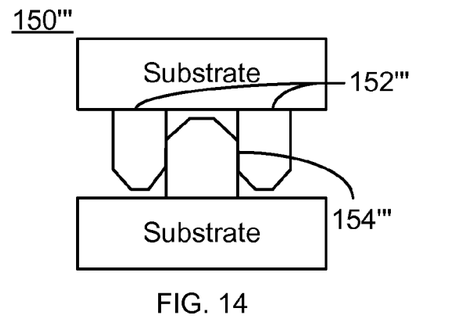
Figure 15:
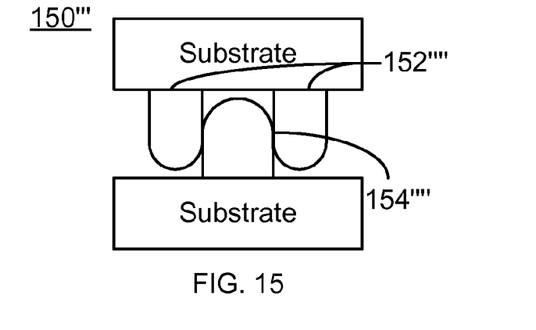

Similarly, other configurations are possible for the interlocking key 148. FIGS. 11-17 are diagrams depicting exemplary embodiments of dots forming an interlocking key for bonding substrates. For clarity FIGS. 11-17 are not to scale and only a portion of the dots are shown. FIG. 11 depicts an interlocking key 150 including dots 152 on one substrate and dots 154 on the other substrate. The dots 152 and 154 are placed such that the key locks the substrates to within a desired tolerance, t. FIG. 12 depicts a key 150' in which the dots 152' and 154' interlock to a distance that is less than the desired tolerance t. FIG. 13 depicts a key 150" in which the dots 152" and 154" may form a bond, such as an Au bond. More specifically, the dots 152" and 154" actually come into physical contact. FIG. 14 depicts a key 150''' in which the dots 152''' and 154''' are tapered. The taper may aid in guiding the dots 152''' and 154''' to form the key 150''' when the substrates are pressed together in step 104 of the method 100. Although all of the dots 152''' and 154''' are shown as being tapered, in some embodiments, only some of the dots 152''' and 154''' might be tapered. For example, only the dots 152''' might be tapered, only the dots 154''' might be tapered, or some portion of the dots 152''' and some portion of the dots 154''' might be tapered. In the key 150''', the dots 152''' and 154''' are in physical contact and may, therefore, form a bond. However, in other embodiments, the dots 152''' and 154''' may be spaced apart. In addition, the dots 152''' and 154''' are shown as having a taper which ends in a flat surface. However, in other embodiments, one or more of the dots 152''' and 154''' may taper to a point. In addition, although shown as composed of flat surfaces, the taper on the dots 152''' and 154''' could include curved surfaces. FIG. 15 depicts a key 150'''' in which the taper on each of the dots 152'''' and 154'''' is formed by a curved surface. In the key 150'''', the dots 152'''' and 154'''' are shown in physical contact. However, in other embodiments, the dots 152'''' and 154'''' may be spaced apart.

Figure 16:
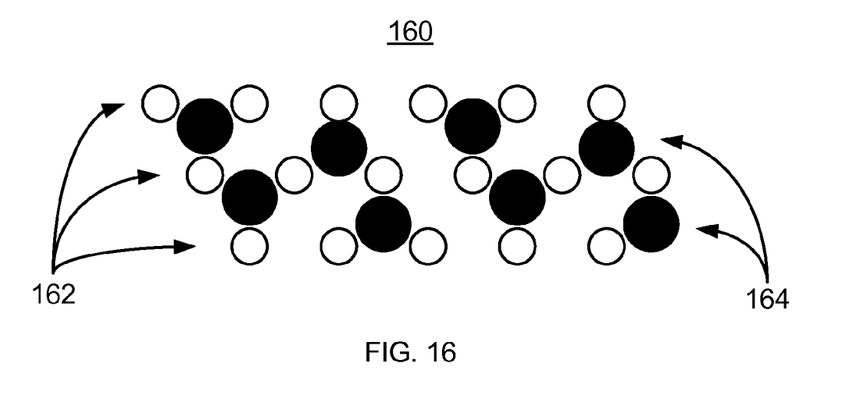
Figure 17:
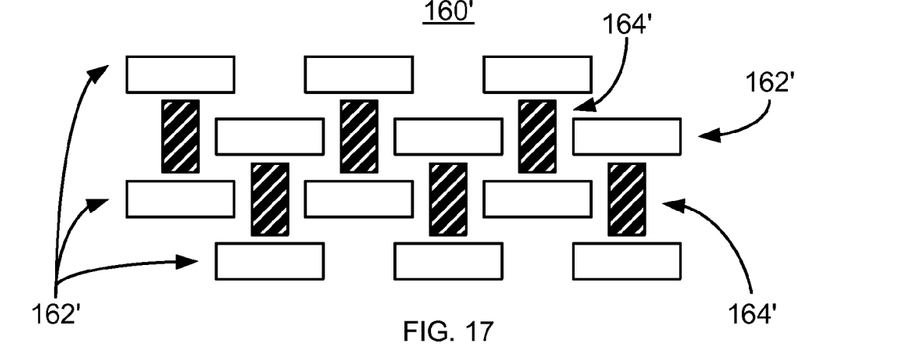
Figure 18:
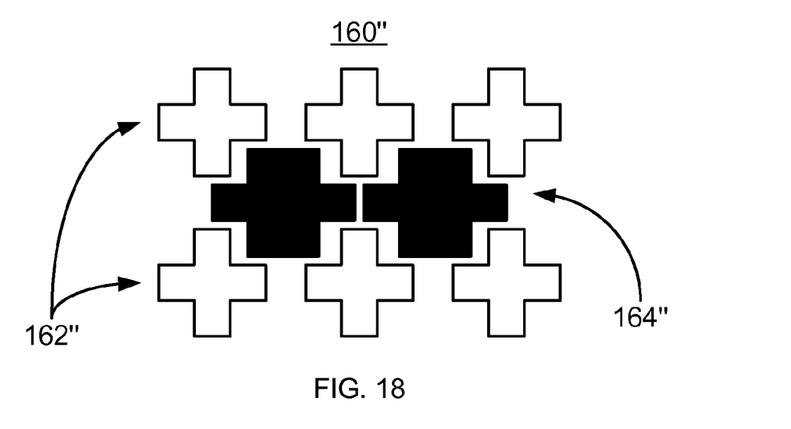

FIGS. 16-18 depict keys in which the dots have various cross sections. For example, FIG. 16 depicts a key 160 in which the dots 162 and 164 have circular cross sections. In the embodiment shown, the dots 162 (which are white) may reside on one substrate while the black dots 164 reside on another substrate. Thus, these dots 162 and 164 are analogous to those described above. FIG. 17 depicts a key 160' in which the dots 162' and 164' have a rectangular cross section. Thus the white rectangles 162' may reside on one substrate while the cross-hatched rectangles 164' reside on another substrate. FIG. 18 depicts a key 160" in which the dots 162" and 164" have a reentrant cross section. In the embodiment shown, the dots 162" and 164" have a cross shape. However, other reentrant shapes are possible. Thus the white crosses 162" may reside on one substrate while the black crosses 164" reside on another substrate. Thus, keys 160, 160', 160" having dots of various cross-sections may be used. In addition, although depicted in a particular configuration with a particular spacing between portions of the keys 160, 160' and 160", other spacings and/or configurations may be used. For example, any combination of the keys 150, 150', 150", 150''', 150'''', 160, 160', 160", and/or 148 might be used.

The keys 150, 150', 150", 150''', 150'''', 160, 160', and/or 160" may be used in connection with the method 100. Thus, interlocking keys 150, 150', 150", 150''', 150'''', 160, 160', 160" of various configurations may be used to retain the alignment through the reflow step. Thus, alignment of the substrates may be improved. Consequently, bonding of substrates, for example for EAMR heads, may be improved.

We claim:

1. A method for performing bonding of a first substrate to a second substrate, the first substrate including a first plurality of solder pads and a first alignment mark set, the second substrate including a second plurality of solder pads and a second alignment mark set, the method comprising:
    aligning the first alignment mark set on the first substrate to the second alignment mark set on the second substrate, the first substrate including a first plurality of dots, the second substrate including a second plurality of dots configured to interlock with the first plurality of dots, the first alignment mark set being aligned with the second alignment mark set corresponding to the first plurality of dots being aligned with the second plurality of dots and the first plurality of solder pads being aligned with the second plurality of solder pads;
    locking the first plurality of dots with the second plurality of dots to form an interlocking key; and
    reflowing at least one of the first plurality of solder pads and the second plurality of solder pads, the first plurality of dots and the second plurality of dots remaining substantially solid during the reflowing step.

2. The method of claim 1 wherein the first plurality of dots and the second plurality of dots include at least one of Au, Cu, Ni, and NiFe.

3. The method of claim 1 wherein the aligning step further includes:
    aligning the first alignment mark set to the second alignment mark set to within 0.5 micron.

4. The method of claim 1 wherein the each of the first plurality of dots has at least one of a substantially circular cross-section, a substantially rectangular cross-section, and a re-entrant cross-section.

5. The method of claim 1 wherein the each of the second plurality of dots has at least one of substantially circular cross-section, a substantially rectangular cross-section, and a re-entrant cross-section.

6. The method of claim 1 wherein the each of at least a portion of the first plurality of dots is tapered.

7. The method of claim 1 wherein the each of at least a portion of the second plurality of dots is tapered.

8. The method of claim 1 wherein the locking step further includes:
    pressing the first substrate against the second substrate.

9. The method of claim 1 wherein the first alignment mark set includes at least one male feature and the second alignment mark set includes at least one female feature corresponding to the at least one male feature.

10. The method of claim 9 wherein the first alignment mark set includes a cross pattern.

11. The method of claim 1 wherein the interlocking key locks the first plurality of dots with the second plurality of dots such that the first substrate remains within a desired tolerance with respect to the second substrate during the reflow step.

12. The method of claim 1 wherein the first plurality of dots and the second plurality of dots are configured to form a bond in the locking step.

13. The method of claim 1 wherein the first substrate includes a laser substrate and the second substrate includes a slider.

14. A method for performing bonding of a laser substrate to a slider, the laser substrate including a first plurality of solder pads and a first alignment mark set, the slider including a second plurality of solder pads and a second alignment mark set, the method comprising:
    aligning the first alignment mark set on the laser substrate to the second alignment mark set on the slider to within 0.5 micron, the laser substrate including a first plurality of dots, the slider including a second plurality of dots configured to interlock with the first plurality of dots, the first alignment mark set being aligned with the second alignment mark set corresponding to the first plurality of dots being aligned with the second plurality of dots and the first plurality of solder pads being aligned with the second plurality of solder pads, the first alignment mark set including a first cross pattern, the second alignment mark set including a second cross pattern configured to interlock with the first cross pattern;

locking the first plurality of dots with the second plurality of dots to form an interlocking key such that the laser substrate remains within a 0.5 micron tolerance with respect to the slider during a reflow step and such that the first plurality of dots is bonded with the second plurality of dots; and reflowing at least one of the first plurality of solder pads and the second plurality of solder pads, the interlocking key remaining substantially solid during the step of reflowing.

\* \* \* \* \*